United States Patent [19]

Miller et al.

[11] Patent Number: 5,116,643

[45] Date of Patent: May 26, 1992

[54] METHOD FOR PREPARING PLZT, PZT AND PLT SOL-GELS AND FABRICATING FERROELECTRIC THIN FILMS

[75] Inventors: William D. Miller, Colorado Springs, Colo.; Leo N. Chapin, Sunnyvale, Calif.

[73] Assignee: National Semiconductor Corporation, Santa Clara, Calif.

[21] Appl. No.: 610,432

[22] Filed: Dec. 19, 1990

Related U.S. Application Data

[63] Continuation-in-part of Ser. No. 520,959, May 9, 1990, Pat. No. 5,028,455, which is a continuation of Ser. No. 57,323, Jun. 2, 1987, Pat. No. 4,946,710.

[51] Int. Cl.⁵ .............................................. B05D 5/12
[52] U.S. Cl. ............................ 427/126.3; 252/62.9; 427/79; 427/96; 427/100; 427/108; 427/162; 427/163; 427/165; 427/226; 427/240; 427/294; 427/376.2; 427/231; 427/234
[58] Field of Search ............... 427/240, 100, 167, 108, 427/164, 168, 126.3, 376.2, 96, 79, 226, 163; 423/263, 598, 608, 594; 252/62.9

[56] References Cited

U.S. PATENT DOCUMENTS

| | | | |
|---|---|---|---|
| 3,124,478 | 3/1964 | Cirkler et al. | 117/200 |
| 3,330,697 | 4/1967 | Pechini | 117/215 |
| 3,330,967 | 7/1967 | Baardewijk et al. | |
| 3,413,083 | 11/1968 | Daendliker et al. | 423/262 |
| 3,637,531 | 1/1972 | Faxon et al. | 423/263 |
| 3,728,694 | 4/1973 | Rohrer | 340/173.2 |
| 3,917,780 | 11/1975 | Mazdiyasni et al. | 264/61 |
| 3,923,675 | 12/1975 | Mazdiyasni et al. | 252/62.9 |
| 4,330,593 | 5/1982 | Shrout et al. | 427/100 |
| 4,477,401 | 10/1984 | Hagemann et al. | 264/61 |

OTHER PUBLICATIONS

"Sol-Gel Processing of PbTiO₃, PbZrO₃, PZT, PLZT Thin Films," K. D. Budd et al., Brit. Cer. Proc., vol. 36, (1985) pp. 107-121.

"Preparation of Ferroelectric Compounds," J. Fukushima et al., Journal of Materials Science, 19 (1984) pp. 595-598.

"Crystallization and Transformation of Distorted Cubic PBTIO₃," O. Yamaguchi et al., J. Am. Ceram., Soc. 69 (10) C-256-C-257 (1986).

"Ferroelectric Arrays: Competition for Core and Semiconductor Memories," Digital Design, Jun. 1973, pp. 30-32.

"Structure Evolution in Sol-Gel Derived Lead Titanate-Base Materials and Application to the Processing of Thin Dioelectric Layers," thesis by K. D. Budd, 1986.

"Sol-Gel Processing of Lead Zirconate Films" R. Lipeles, N. Ives, N. Leung (1985).

(List continued on next page.)

*Primary Examiner*—Janyce Bell
*Attorney, Agent, or Firm*—Richards, Medlock & Andrews

[57] ABSTRACT

A method to produce thin films suitable for fabricating ferroelectric thin films. The method provides for selection of the predetermined amounts of lead, lanthanum, zirconium, and titanium precursors which are soluble in different solvents. Dissolving predetermined amounts of the precursors in their respective solvents in proportions such that hydrolyze reaction rate for each metal precursor will be approximately equal. Preferably, the reaction is performed under an inert atmosphere at from about 350 mmHg to 650 mmHg pressure. The precursors and solvents are mixed, and water is added to begin a hydrolysis reaction. After the hydrolysis the solution is heated to drive off the excess water and solvent to promote the formation of a sol-gel. The sol-gel is then applied to a thin substrate and sintered to produce the ferroelectric film.

38 Claims, 2 Drawing Sheets

OTHER PUBLICATIONS

"Conductivity and Anomalous Polarization in Ceramic Ferroelectrics with Perovskite Structure," O. I. Prokopalo, vol. 14, pp. 683–685 (1976).

"Amorphous and Crystalline Dip Coatings Obtained from Organometallic Solutions: Procedures, Chemical Processes and Products," H. Dislich & E. Hussmann, Thin Solid Films, vol. 77, pp. 129–139 (1981).

"Colloidal versyus Polymer Gels, and Monolithic Transformation in Glass-Forming Systems," D. P. Partlow & B. E. Yoldas, Journal of Non-Crystalline Solids, vol. 46, pp. 153–161 (1981).

"Metal Alkoxides," D. C. Bradley, R. C. Mehrotra & D. P. Gaur, Academic Press (1978).

"Applications of Sol-Gel Methods for Glass and Ceramics Processing", J. D. McKenzie, Ultrastructure Processing of Ceramics, Glasses and Composites, pp. 15–26 (1984).

"Dielectric Constant of Amorphous $PbTiO_3$," M. Takashige, T. Nakamura, N. Tsuya, K. Arai, H. Ozawa & R. Uno, Japanese Journal of Applied Physics, vol. 19, No. 9, pp. L555–L558 (Aug. 1980).

"Glassy and Crystalline Systems from Gels: Chemical Basis and Technical Application" H. Dislich, Journal of Non-Crystalline Solids, vol. 57, pp. 371–388 (1983).

"History and Principles of the Sol-Gel Process, and Some New Multicomponent Oxide Coatings," H. Dislich and P. Hinz, Journal of Non-Crystalline Solids, vol. 48, pp. 11–16 (1982).

Principles and Applications of Ferroelectrics and Related Materials, Lines and Glass, pp. v–vii, and 559–561.

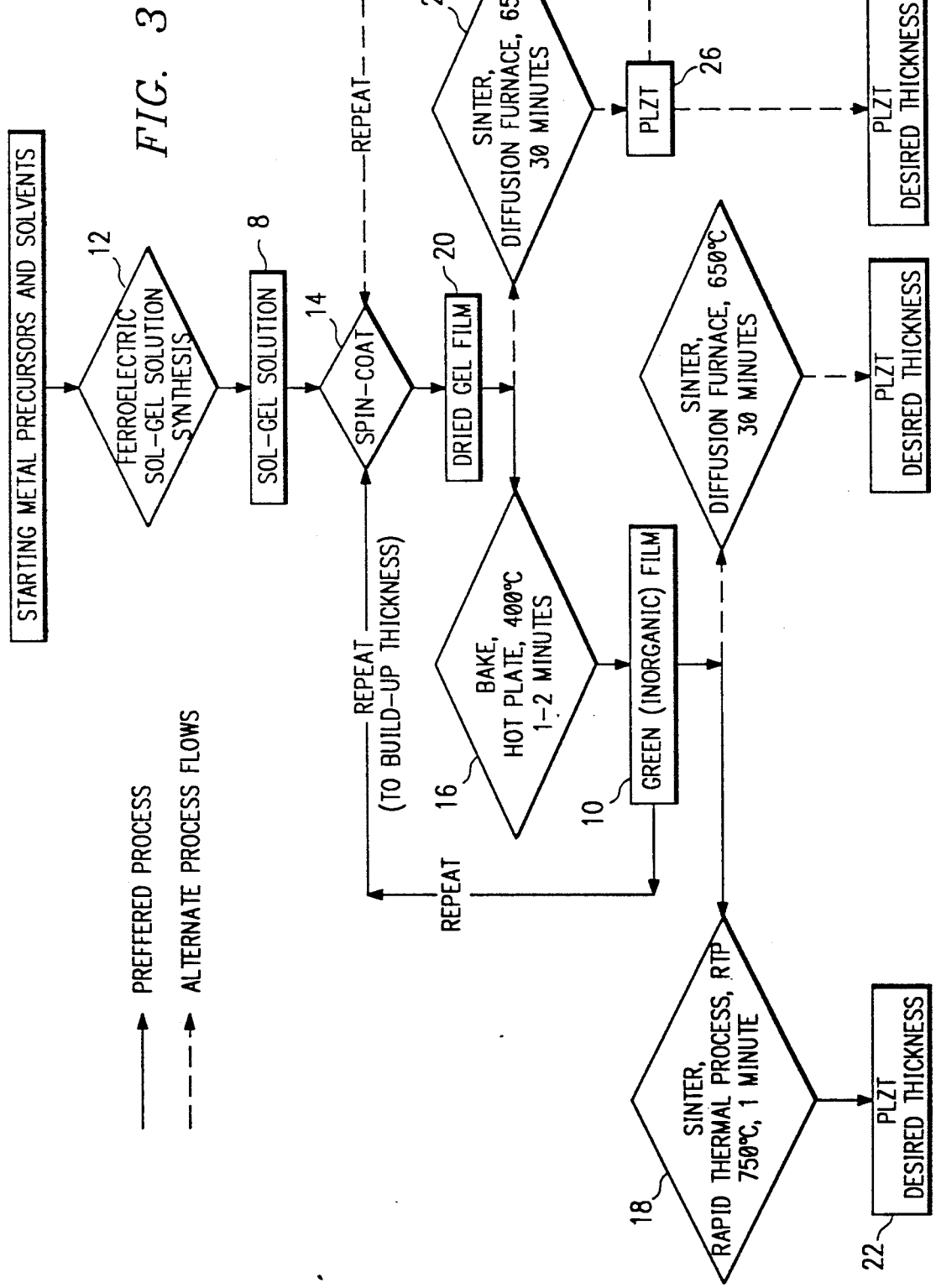

METHOD FOR PREPARING PLZT, PZT AND PLT SOL-GELS AND FABRICATING FERROELECTRIC THIN FILMS

This is a continuation-in-part of application Ser. No. 520,959, filed May 9, 1990, now U.S. Pat. No. 5,028,455 which is a continuation application of application Ser. No. 057,323 filed on Jun. 2, 1987, now U.S. Pat. No. 4,946,710.

TECHNICAL FIELD

The present invention relates to methods for preparing sol-gels and the subsequent use of these gels to fabricate ferroelectric thin films of compositions from the PLZT family which are particularly suited for applications in electrical devices such as random access memory devices and optical sensors.

BACKGROUND ART

In the art of microcircuit designs and other electronic applications it was recognized some years ago that ferroelectric materials could be used much like capacitors in a dynamic random access memory (RAM). The term "ferroelectric material" is somewhat of a misnomer because many of these materials do not contain iron. However, the name implies that they possess ferroelectric properties analogous to their ferromagnetic counterparts. It was hypothesized early in the electronic memory industry that a nonvolatile random access memory with high performance and good economics could possibly be fabricated if a suitable ferroelectric material were found, such as discussed in "Ferroelectric Arrays: Competition for Core and Semiconductor Memories," pages 30-32, *Digital Design*, June 1973.

Thus, the art has searched for a ferroelectric material that was easily deposited, sputtered, or otherwise controllably applied to suitable substrates and would have properties compatible with the subsequent MOS processing or other electrical applications. It was recognized early that the thin film needed to be defect free, retain its polarity, and have good fatigue resistance. A significant potential advantage over current nonvolatile NMOS technology is that ferroelectric memory is known to have an endurance cycle of better than $10^{10}$ read and write cycles compared to $10^6$-$10^7$ cycles of the floating gate MOS technology.

Different ferroelectric materials have been proposed, such as potassium nitrate (KNO3), as discussed in the above-referenced *Digital Design* article and also in the March 1983 issue of *Computer Design*. Other materials proposed were PZT and PLZT. PZT is an acronym for a lead zirconate titanate ceramic. PLZT is an acronym for a ceramic of lead, lanthanum, zirconium and titanium $Pb_{1-3x/2}La_x(Zr_yTi_{1-y})O_3$. Another proposed material was lead titanate (Pb TiO3), as discussed in "Crystallization an Transformation of Distorted Cubic PbTiO3," page C-256, 7 *J. Am. Ceram. Soc.* 69, October, 1986.

Sputtering techniques have been investigated for applying these films. This technique suffers from the disadvantages that it requires expensive equipment, the composition deposited does not always correlate to the mixture utilized for the sputtering, which gives rise to quality control problems, and importantly, films deposited on certain substrates were not smooth and contained cracks and other deficiencies. Attempts to sputter PZT films onto silicon substrates, the most common substrate in the semiconductor industry, are characterized by microcracks probably resulting from different thermal coefficients between the silicon substrate and the sputtered PZT film, which, in order to achieve a useful thickness, required multiple sputtering cycles. Furthermore, the very low deposition rates in sputtering are not practical for commercial-scale production. Also, the high temperature necessary for sputtering is not desirable because it disturbs dopants in the substrate. Some investigation of sol-gel processing of PZT and PLZT to provide thin films is recorded in "Sol-Gel Processing of PbTiO3, PbZro3, PZT, and PLZT Thin Films", *Brit. Cer. Proc. Vol.*, Vol. 36, 1985, pages 107-121. See also "Preparation of Ferroelectric PZT Films by Thermal Decomposition of Organometallic Compounds," pages 595-598, *Journal of Materials Science*, Vol. 19 (1984). This article reports some successes but the techniques used were deficient in several regards, such as the reported crystallization temperature was too high, resulting in the grain structure produced being too large for capacitor areas required in microelectronic memories, and some of the films had problems with cracking. A method which uses a lower temperature is desirable because diffusion of dopants in the substrate becomes significant if temperatures exceed 900° C., and adhesion problems related to metal pads and interface occur above about 750° C. Furthermore, the time required to produce a usable thickness was too long. Thus, for a long time there has been a need in the industry to find a method and composition to produce a ferroelectric material which in practice could be produced economically, applied to various substrates in the required purity and have physical characteristics necessary for use in thin films suitable in the manufacture of integrated circuits. Furthermore, not only was the development of suitable materials required, but also that a process be developed by which suitable materials could be reproducible and confidently applied to substrates having the desired composition as well as the desired adhesion, integrity, thickness, and other physical characteristics necessary for dependable performance for supporting commercial utilization.

A sol-gel refers to a composition which is made as a solution and then formed into a gel which forms an open lattice structure when it is dried. The perovskite crystalline class of ferroelectric ceramics, and more specifically lanthanum modified lead zirconate titanates, or PLZTs, have been known and used commercially in bulk form. Perovskites have a body centered cubic or pseudocubic crystal lattice structure in a general chemical formula (crystalline unit cell composition) of $ABO_3$ where A is a metal cation a+2 (or +1 or +3) oxidation state, B is a metal cation in the +4 (or +3 or +5) oxidation state, and O is oxygen in a −2 state. Thus for PLZT, Pb or La occupy the "A" sites or the cubic (or pseudocubic) cell corners, the Zr or Ti occupies the "B" site at or near the cell center and oxygen is located in the cell faces. The present invention utilizes sol-gels to produce thin films in the PLZT family of films such as PLZT, PZT, and PLT compositions which can be utilized in fabricating ferroelectric thin films reproducibly and having required physical and chemical characteristics for reliable performance in electrical, as well as optical, applications. The present invention is advantageous in that PLZT, PLT and PZT films of varying compositions can be easily applied as thin films to suitable substrates by spin coating methods with equipment common in the semiconductor industry. These films can be applied with a high degree of quality control, and the composition of the applied film can be easily and reliably selected as desired using the method of the present invention.

SUMMARY OF THE INVENTION

In one aspect the invention relates to a procedure for producing a homogeneous and uniform mixture of two or more of the following metals: lead, lanthanum, titanium and zirconium. The homogeneous mixture is then processed to achieve a sintered thin film of a composition within the PLZT family. The sintered PLZT family films are crystalline ceramics with a pseudocubic perovskite structure (cubic, tetragonal, rhombohedral or orthorombic depending on the composition and temperature) having the following general chemical formula: $Pb_{1-3x/2}$ and $La_x(Zr_yTi_{1-y})O_3$. The most common members of the PLZT family are PLZT, PLT and PZT, which can have various ratios of the components present. The films can also be PZ and PT. "Sintered" refers to the final ceramic composition of the PLZT family. As used herein, "green" will refer to compositions and thin films of compositions which can be sintered to produce ceramic films of the PLZT family. The final sintered film is formed by first forming a sol-gel of precursors of the materials to be present in final film. In the case of a PLZT film, the sol-gel is produced by forming a solution of precursors of the lead, lanthanum, zirconium and titanium, each of which is soluble in a different solvent, and combining the precursors such that upon hydrolysis, the hydrolysis reaction of each precursor is approximately equal. Upon condensation, the mixture results in the formation of a homogeneous gel of the desired green composition. In one embodiment, the sol-gel can then be applied by spin coating techniques to a suitable substrate forming a green film which crystallizes to form a sintered PLZT thin film upon the substrate. Precursors of the metals (lead, lanthanum, zirconium and titanium) to be present in the final film, each of which is soluble in a different solvent, are weighed to provide the required amount of each metal in the PLZT family, if any, desired in the final thin film to be applied to the substrate. Any precursors of lead, zirconium and titanium which can be hydrolyzed and which will condense into oligomers and polymers, such as metal alkoxides, metal acetates and metal esters, can be used. A lanthanum precursor soluble in a different solvent from those for the other precursors can be used. However, because lanthanum is normally used in such a small amount, a lanthanum precursor soluble in a solvent or one of the other precursors can be used. Furthermore, it is not necessary that lanthanum be in the form of a precursor, although one may be used. There is such a small amount of lanthanum needed that it can be incorporated into the other precursors and solvents by solution or suspension with good results. The precursor compounds are dissolved in their respective solvents and each is diluted with solvent in proportions such that the reaction rates for the hydrolysis of each precursor are approximately equal. The precursors and their respective solvents are then mixed together with a predetermined amount of solvent at a temperature and with sufficient agitation to form a solution. A small amount of water is added to initiate sufficient hydrolysis reaction to create reactive sites upon the precursors. The amount of water is less than the amount which causes the hydrolysis reaction to proceed to the condensation reaction which results in precipitation of solids. The hydrolysis reaction can be stopped or quenched by the dilution of the mixture with excess additional solvents. In the alternative, the hydrolysis reaction in some cases can be controlled by the rapid cooling of the mixture (without the addition of additional solvents) before the condensation reaction begins to precipitate solids. If the reaction is quenched by dilution with additional solvents, it is preferred to use a solvent mixture in the same ratios used previously to dissolve the precursors. The solution is then concentrated by distillation, thereby reducing the solvent content and initiating a condensation reaction between the reactive sites on the organometal compounds which forms an organometallic sol-gel. Boiling is continued until the sol-gel has the desired viscosity for the application of a thin film of the sol-gel to a suitable substrate, such as a silicon substrate, by spin application techniques. The viscosity will vary with the composition of the final PLZT family film desired, but in general, suitable viscosities are in the range of 1 to 5 centipoises, and preferably 1 to 3 centipoises. Preferably, these steps are carried out in an inert atmosphere or in a very dry atmosphere to prevent absorption of water vapor which would carry the hydrolysis reaction beyond the desired degree.

In one embodiment of the present invention, the sol-gel thus formed can be applied to the substrate by spin coating techniques. The term "sol-gel" describes a liquid system of reactive or polymerizable materials in solution, which, under the proper conditions of drying, dehydration, or further reacting, will exhibit a gradually increasing viscosity due to increasing concentration and reacting, and then, as crosslinking and polymerization accelerates, an abrupt increase in viscosity occurs when gel formation occurs. In this application, the terms "sol" and "gel" are used to refer generally to sol-gel systems. After application of the green thin film of a composition from the PLZT family, the film is heated at a temperature from the range of about 300° C. to about 425° C. to drive off excess solvent. About 2 to 4 minutes is usually sufficient for excess solvent to be driven off. Additional layers of sol-gel can then be applied over the dried green film if desired. These additional layers may either be of the same or a different composition from the previous layer. The additional layers are then dried also. Thereafter, the resulting dried green film is then sintered in an oxygen containing atmosphere, and preferably in an oxygen enriched over an ambient air atmosphere, at a temperature of from about 475° C. to about 700° C., and preferably from about 500° C. to about 650° C., and most preferably from about 550° C. to about 650° C. In another embodiment, a layer or layers of the sol-gel are applied to the substrate at room temperature without drying. After application of the green thin film of the sol-gel by spinning techniques, the gel film is then sintered by heating the gel to in the range of from about 475° C. to about 700° C., preferably from about 500° C. to about 650° C., and most preferably from about 550° C. to about 650° C. The rate of heating is controlled to prevent the too rapid evolution of solvent liquid which would disrupt the film, and preferably is done in an oxygen atmosphere to completely combust the solvents and to provide oxidation of the lead, lanthanum, zirconium and titanium to form the desired ceramic PLZT layer. Thereafter, a second layer of sol-gel can be applied to the sintered layer if a thicker film is desired. This embodiment of the invention is less desired than that previously discussed for when multiple layers are needed, because it typically requires a long time, creates more stress of MOS circuitry and other components, and is more difficult to etch.

In a preferred embodiment of the present invention, a PLZT film is prepared from a sol-gel wherein the lead precursor is lead tetraacetate which is solubilized in glacial acetic acid at a temperature above about 70° C. The zirconium precursor is zirconium n-butoxide, and the titanium precursor is titanium (IV) isopropoxide. The zirconium tetrabutoxide can be dissolved in n-butanol and the titanium isopropoxide is dissolved in isopropanol. The zirconium and titanium precursors may be dissolved separately or in a solution of the n-butanol and the isopropanol. The lanthanum precursor is lanthanum, 2,4 pentanedionate and is dissolved in butyl alcohol or isopropanol or a mixture of the two. The zirconium precursor or the mixture of the zirconium precursor and titanium precursor is combined with the lanthanum precursor and related solvents. The lanthanum, titanium and zirconium precursors and their solvents are then added to the solution of lead tetraacetate and acetic acid solution at a temperature in the range of from about 70° C. to about 90° C. and lightly agitated to obtain a clear homogeneous solution. Thereafter, deionized water in an amount sufficient to cause hydrolysis but not great enough to cause precipitation is added. It has been found that in the above-described preferred embodiment, water in the range of from about 1 to about 4 molar amounts, based on the moles of zirconium tetrabutoxide and titanium isopropoxide, is sufficient. The solution to which deionized water is added may have color or may become colored (but still remain transparent) immediately upon addition of $H_2O$. Additional agitation with heating normally results in a clear, colorless (water white) homogeneously mixed solution in from about 5 minutes to about 10 minutes. It is after this 5 to 10 minute interval that excess solvent is added to quench the hydrolysis reaction. Excess solvents are then added, preferably, on a proportional basis while stirring the solution to quench the hydrolysis reaction. Thereafter, the mixture is boiled to drive off the water, reduce the solvent content and promote condensation of organometallic compounds (concentration step) until the sol-gel has a viscosity appropriate for applying the sol-gel to suitable substrates by spinning techniques. When the desired viscosity is reached, the sol-gel is applied to a substrate by spinning techniques and then heated in an oxygen containing atmosphere to promote crystallization and formation of the PLZT ceramic in a temperature range of from about 475° C. to about 700° C.

In another aspect, the invention relates to conducting the concentration step, i.e., the heating of the mixture of precursors and solvents at reduced pressure, preferably at a pressure of 350-650 mm of mercury. The perovskite crystalline structure has the general chemical formula $ABO_3$ as discussed above. More specific formulas for PLZT are as follows:

$ABO_3$ becomes,

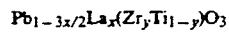  [1]

or 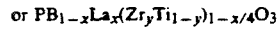  [2]

Formulas [1] and [2] maintain electrical neutrality within the crystalline unit cell when a tri-valent dopant or modifier such as La is used in place of Pb. Formula [1] assumes that La substitution produces Pb vacancies in the crystal lattice at the "A" sites; formula [2] assumes a 1:1 substitution of La for Pb and the creation of "B" site vacancies to maintain electrical balance. A shorthand nomenclature used to describe PLZT compositions is common in the industry. Referring to formula [1] above, let $L=100(x)$, $Z=100(y)$, and $T=100(1-y)$, then the L/Z/T ratio defines a composition. As examples, 0/0/100 PLZT refers to lead titanate ($PbTiO_3$), 0/100/0 PLZT is lead zirconate ($PbZrO_3$), and 8/40/60 PLZT is a lanthanum modified lead zirconate titanate ($Pb_{0.88}La_{0.08}(Zr_{0.40}Ti_{0.60})O_3$). Depending upon composition and temperature, the crystal structure of PLZT ferroelectric perovskites are either rhombohedral (a distortion along a body diagonal of a cube) or tetragonal (an elongation of one cube axis, termed the c axis) and the unit cells are reversible dipoles. This latter feature is the notable physical attribute that is used to make a nonvolatile IC memory. Normally, domains (aggregates of dipoles oriented in the same direction) are randomly oriented in films that are newly made and have never been subjected to an electric field, but a field applied across the film can pole or orient the domains in one of two possible directions parallel to the distortion axis of the crystal. Using the proper electronic sensing techniques, the poled direction can be determined. The two possible poled directions are the binary 0 or 1 of a digital memory cell. It is only in recent years that material and process developments have advanced to the point where ferroelectric thin films (<1 μm thick) can be fabricated reliably and fully integrated with standard CMOS IC technology to produce nonvolatile memory devices. It is important to remember that PLZT (which includes PZT ®, a registered trademark of Vernitron Corp.) is an acronym for a perovskite crystalline family of ceramics containing some or all of the elements Pb, La, Zr, Ti and Oxygen, and not just an amorphous homogeneous mixture of metal oxides. Also, depending upon composition and temperature, other crystalline phases exist which are not ferroelectric but are either paraelectric or antiferroelectric. The former may be of substantial interest as a high dialectric constant material for use in electronics.

BRIEF DESCRIPTION OF THE DRAWINGS

FIG. 3 is a flow diagram showing the process options for fabrication of PLZT thin films.

DETAILED DESCRIPTION

Figure 1:
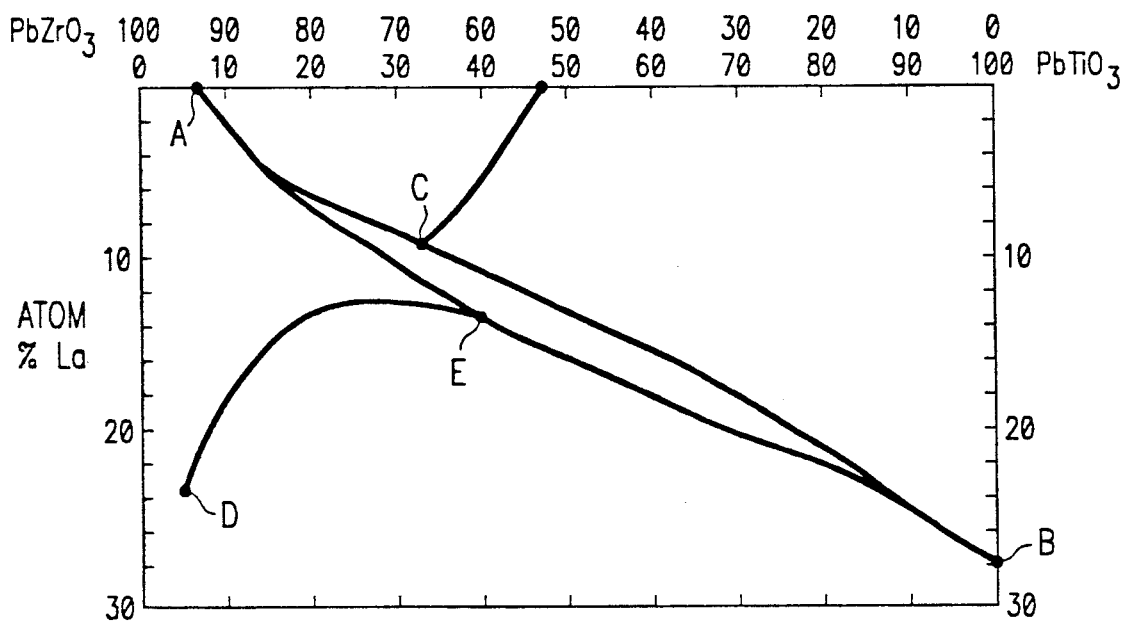
FIG. 1 is a phase diagram of some compositions which can be made with the method of the present invention.

The present invention relates to a method for producing ferroelectric films containing lead and one or more of the following: titanium, zirconium and lanthanum. Most commonly these are PLZT, PZT and PLT thin films. This is done by preparing a sol-gel of predetermined composition and applying it to substrates using spin coating techniques known in the semiconductor industry, such as described in *Semiconductor & Integrated Circuit Fabrication Techniques*, 1979, Reston Publishing Company Inc., pp. 105-107. PLZT is an abbreviation for lanthanum doped lead zirconate titanate, a ferroelectric material in the crystalline form. PZT is an abbreviation for lead zirconate titanate, a ferroelectric material in the crystalline form. PLT is an abbreviation for lanthanum doped lead titanate.

$ABO_3$ becomes, $$Pb_{1-3x/2}La_x(Zr_yTi_{1-y})O_3 \quad [1]$$

or $$PB_{1-x}La_x(Zr_yTi_{1-y})_{1-x/4}O_3 \quad [2]$$

Formulas [1] and [2] maintain electrical neutrality within the crystalline unit cell when a tri-valent dopant or modifier such as La is used in place of Pb. Formula [1] assumes that La substitution produces Pb vacancies in the crystal lattice at the "A" sites; formula [2] assumes a 1:1 substitution of La for Pb and the creation of "B" site vacancies to maintain electrical balance. A shorthand nomenclature used to describe PLZT compositions is common in the industry. Referring to formula [1] above, let $L=100(x)$, $Z=100(y)$, and $T=100(1-y)$, then the L/Z/T ratio defines a composition. As examples, 0/0/100 PLZT refers to lead titanate ($PbTiO_3$), 0/100/0 PLZT is lead zirconate ($PbZrO_3$), and 8/40/60 PLZT is a lanthanum modified lead zirconate titanate ($Pb_{0.88}La_{0.08}(Zr_{0.40}Ti_{0.60})O_3$). Depending upon composition and temperature, the crystal structure of PLZT ferroelectric perovskites are either rhombohedral (a distortion along a body diagonal of a cube) or tetragonal (an elongation of one cube axis, termed the c axis) and the unit cells are permanent dipoles. This latter feature is the notable physical attribute that is used to make a nonvolatile IC memory. Normally, domains (aggregates of dipoles oriented in the same direction) are randomly oriented in films that are newly made and have never been subjected to an electric field, but a field applied across the film can pole or orient the domains in one of two possible directions parallel to the distortion axis of the crystal. Using the proper electronic sensing techniques, the poled direction can be determined. The two possible poled directions are the binary 0 or 1 of a digital memory cell. It is only in recent years that material and process developments have advanced to the point where ferroelectric thin films (<1 μm thick) can be fabricated reliably and fully integrated with standard CMOS IC technology to produce nonvolatile memory devices. It is important to remember that PLZT (which includes PZT ®, a registered trademark of Vernitron Corp.) is an acronym for a perovskite crystalline family of ceramics containing some or all of the elements Pb, La, Zr, Ti and Oxygen, and not just an amorphous homogeneous mixture of metal oxides. Also, depending upon composition and temperature, other crystalline phases exist which are not ferroelectric but are either paraelectric or antiferroelectric. The former may be of substantial interest as a high dialectric constant material for use in electronics. Stoichiometry of these films can vary. The stoichiometry of any particular PLZT, PZT or PLT composition is expressed by the "lanthanum/zirconium/titanium" content in the resulting solid solution.

$$Pb_{1-L/100} La_{L/100} (Zr_{Z/100} Ti_{T/100}) O_3$$

PLZT family compositions with the following stoichiometry have been prepared: 3/70/30; 3/60/40; 0/50/50 (PZT), 3/50/50; 3/40/60; 6/40/60; 8/40/60; 10/40/60; 0/60/40 (PZT); 8/0/100 (PLT); 15/0/100 (PLT); and 0/53/47 (PZT). The above expression is based on percentages by mole ratios. The expression L/Z/T as 30 in 3/70/ for example) is shorthand for expressing %Pb+%La=100=%Zr+%Ti where percentage is based on atomic percent or mole ratios of atoms. A 3/70/30 (PLZT) is 97 atoms Pb and 3 atoms La to 70 atoms Zr and 30 atoms Ti (or 97% Pb and 3% La to 70% Zr and 30% Ti). A 0/53/47 (PZT) is 100 atoms Pb and 0 (zero) atoms La to 53 atoms Zr and 47 atoms Ti. An 8/0/100 (PLT) is 92 atoms pb and 8 atoms La to 0 (zero) atoms Zr and 100 atoms Ti.

$$(P+L):(Z+T)=100:100$$

or $$(P+L)=100=(Z+T)$$

or $$(P+L)+(Z+T)=200$$

The general chemical formula for PLZT compositions (which can include PZT and PLT) is:

$$Pb_{1-L/100}La_{L/100}(Zr_{Z/100}Ti_{T/100})O_3.$$

A 3/70/30 PLZT is:

$$PB_{1-3/100}La_{3/200}(Zr_{70/100}Ti_{30/100})O_3$$

which equals $$Pb_{0.97}La_{0.03}(Zr_{0.70}Ti_{0.30})O_3.$$

Note that in the formula the total of the Pb and La is 1 as is the total of the Zr and Ti. The sum of the Pb and La is "normalized" to 1; Pb+La=1.

Normally, in the calculations for PLZT sol-gel synthesis percent by weight is not used.

FIG. 1 is a phase diagram of compositions at standard temperature and pressure (25° C. and 1 atmosphere). Points on the graph represent ferroelectric compositions made by the sol-gel method of the present invention. In general, compositions above the line ABC have forroelectric properties. Compositions within area AED have electro optical properties, and in area DEB the compositions can have electro optical properties created by field induced distortions.

One advantage of the present invention is that PLZT, PZT or PLT films of varying, but predetermined, composition can be readily prepared, and the composition of the deposited film can be accurately predicted, unlike prior sputtering techniques. "Sol-gel" is a term commonly used in the ceramics industry and indicates that processing starts with a solution which is then formed into a gel. The present invention relates to forming a partially gelled product which is then applied to a substrate as a film and oxidized to crystalline the film.

One of the deficiencies in the art prior to the present invention has been the inability to obtain, on a reproducible basis, deposited films from the PLZT family, such as PLZT, PZT or PLT, thin films having the same characteristics. The prior art sputtering techniques suffer from the deficiency that compositional control of the final film was difficult because of the different sputtering rate of the elements. It is postulated that deficiencies in film characteristics of films produced by earlier methods resulted from the failure of previous methods to apply PLZT, PLT, or PZT thin films which had the atoms of zirconium, lead, lanthanum, and titanium homogeneously mixed throughout the thin film. (In PZT films there is no lanthanum.) Although the inventors do not wish to be bound to any theory, it is believed that the previous techniques resulted in variable segregation of these materials in the final solid product which then resulted in varying ferroelectric properties of films, even though they contained the same relative proportions of lead, lanthanum, zirconium and titanium. The present invention relates to PLZT, PZT or PLT films which have a homogeneous distribution of lead, lanthanum, zirconium and titanium which may be present in the resulting ceramic layer and further comprises a method for producing such a film.

In the method of the present invention, a solution of precursors is made containing lead, zirconium, titanium and lanthanum in the desired final film amounts. These solutions may be made from commercially available precursors such as lead tetraethylhexanoate, zirconium acetylacetonate, titanium (IV) tetrabutoxide, titanium isopropoxide, zirconium tetrabutoxide, lanthanum 2,4 pentanedionate, and other acetates and alkoxides which are capable of forming organometallic polymer gels can be utilized. In many instances the lanthanum precursor can be lanthanum itself. Because it is present in such small amounts, it can be effectively mixed without the need for it to be in the form of an acetate or alkoxide precursor. As the size of the organic functional group increases, it is more likely to cause defects such as cracks in the final film when the organics are volatized. Lead tetra-ethylhexanoate is a less desirable precursor because the large organic group is more likely to result in defects in the final film. The preferred organic functional groups are methanol, butanol, ethanol, acetate and propanol. An important feature of the present invention is achieving a homogeneous gel in which the metals, such as lead, lanthanum, zirconium and titanium in a PLZT family film, are uniformly distributed throughout the polymer structure of the gel and which will then result in the homogeneous distribution of these metals in the crystal lattice of the final inorganic material.

While not being bound by any theory, it is believed that a homogeneous distribution of metal ions in the polymer network results in lower crystallization temperatures and lower defect density. The crystallization temperature is believed to be lowered because it is limited by crystallization energy and not diffusion of metallic constituents in the network. This method avoids segregation, or the formation of pockets of one or more of the metals, which would result in differing ferroelectric properties in PLZT family films with the same overall compositions and differing properties in different locations within the same PLZT family thin film. In some instances, such segregation can create localized areas that are not ferroelectric.

Homogeneous mixing is obtained by the utilization of precursors soluble in different solvents. While there may be some solubility of the various precursors in solvents for the other precursors, the solubility is generally so small in comparison to the primary solvent that it is not significant. The dissolved precursors are then combined in a mixture. In order to obtain a solution, it may be necessary to heat and agitate one or more of the precursors in the final mix of all the precursors and solvents. Certain precursors can be solubilized together then added to the other precursors. For example, the alkoxide precursors can be dissolved in a solution which is a mixture of both their respective solvents and then added to a solution of acetate precursors. It is recognized that acetates are esters and are used in a similar way.

The amount of solvent utilized for each precursor is determined by the amount of solvent necessary such that the hydrolysis reaction rate of each metal precursor is approximately the same as determined by Le-Chatelier's principle. The amount of solvent for each precursor can be determined by determining the rate of the hydrolysis reaction for each single precursor. Many of these reaction rates are reported in the literature or they can be determined by known experiment techniques. The amount of solvent used for each is then portioned such that the rate of reaction for each precursor is approximately equal. For example, if the reaction ratio of one of the precursors is three times faster than the others, which are approximately equal, then three times as much solvent is used for the faster reacting precursor. Thus, when all are combined, the reaction rates are approximately equal. The hydrolysis reaction rates of the various precursors may be altered when the precursors are combined with the other solvents and other precursors. If this occurs the portions are adjusted accordingly. The initial quantities of solvents should be proportional and sufficient to completely dissolve the precursor for which it is used. The precursors and solvents are agitated, with heat if necessary, to form a homogeneous solution. In general, the formation of a homogeneous solution is achieved when the solution becomes clear from a cloudy condition. Clear does not mean that the solution is colorless, but rather that it is transparent, which indicates that the materials are distributed homogeneously and not merely suspended by mechanical or thermalagitation. Thereafter, a small amount of water is added to promote hydrolysis of the dissolved metal precursors. A complete hydrolysis reaction is not desired and should be avoided because that would result in the precipitation of the product as a solid and prevent its application as a homogeneous gel. In general, an amount of water between about 1 to 4 moles computed on a molar basis of the zirconium and titanium precursors has been found useful. The hydrolysis reaction is shown below:

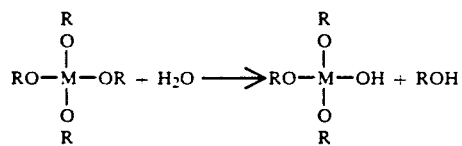

where M is a metal and OR is an alcohol functional group and ROH is an alcohol. For acetate precursors the reaction is exemplified as:

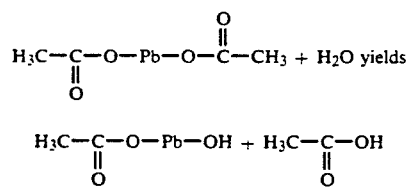

The hydrolysis reaction is quenched (slowed or halted) by the dilution of the mix with additional solvent preferably added in the same ratios as previously used. A five-fold dilution has been found sufficient. Alternatively, the hydrolysis reaction may be quenched by the rapid cooling of the solution, with or without dilution. Quenching by cooling of the solution is less desired because it is more difficult to control.

Thereafter, heat is applied to drive off the azeotrope water and solvents and to initiate a condensation reaction which then forms the organometal sol-gels as exemplified above. The result is to form a gel which is a group of organometallic polymers having a homogeneous distribution of the metal atoms throughout the polymers. The boiling process is continued until a sol-gel is obtained having the desired viscosity for application of the sol-gel in a thin film to a substrate, such as a silicon or gallium arsenide wafer as commonly used in the semiconductor industry, by spin coating techniques. Useful viscosity for these organometal sol-gels has been found to be in the range of about 1 to 5 centipoises, and preferably from 1 to 3 centipoises.

Preferably, the solution is heated while the solution is maintained under reduced pressure, ranging from about 350 mmHg to about 650 mmHg. By reducing the pressure, the reaction temperature is also reduced. As a result, the reaction rate is lowered. By decreasing the reaction rate, it has been found to be beneficial that the components are permitted to react with less likelihood of precipitating prior to quenching. A pressure range of from about 350 mmHg to about 650 mmHg is considered to be preferred to achieve the benefit of reducing precipitating and complete the concentration process within a reasonable time. However, it is also recognized that the present reaction may proceed at a pressure lower than 350 mmHg. Yet, if one were to conduct the present reaction at a pressure lower than 350 mmHg, not only would it fail to be commercially viable, but the lower the pressure becomes, the slower the reaction rate would be, eventually realizing virtual stagnation of the entire reaction. Under severely reduced pressure (less than 300 mmHg) and temperature, precipitation occurs (believed to be unreacted Pb precursors).

It is desirable that this dissolving of the precursors and the boiling off of the solvents is done in an extremely dry atmosphere and preferably an inert atmosphere. This prevents the absorption of water vapors from the atmosphere which could result in the hydrolysis reaction proceeding too far and causing the undesirable precipitation of solids. One advantage of the present invention is that the formed sol-gel can be stored in a dry or inert atmosphere for an extended period of time and can thus accommodate variations in demand and in production schedules.

The sol-gel is applied to suitable substrates such as silicon wafers which have undergone preliminary processing for fabricating integrated circuit elements and which may have a patterned platinum electrode for receiving the PLZT family film. Spin application techniques of sol-gels with viscosities from 1 to 5 centipoises usually produce a thin green film of the gel between about 750 Angstroms to about 1500 Angstroms in thickness. The green film is then oxidized to form the final sintered PLZT ceramic which has a homogeneous distribution of the lead, lanthanum, zirconium and titanium as was present in the gel applied. The formed sintered film of PLZT, PZT or PLT is normally about one third of the thickness of the gel film applied or from about 250 Angstroms to 500 Angstroms. Thicker sintered films can be formed in the substrate by applying multiple layers. For example, a first layer can be applied and sintered, and then a second layer can be applied over the first and sintered.

FIG. 3 illustrates another method to which the present invention relates for applying more than one green film 10 to a substrate without the need to sinter the previously applied green film 10. The term "green film" means the film formed by applying a sol-gel solution 12 after the spin-coating step 14 and baking 16 but prior to sintering 18. The green film 10 thus has the solvents and organics removed by volatilization or pyrolytic decomposition but PLZT crystal formation has not yet occured. This method involves applying a thin dried gel film 20 to the substrate, thereafter baking 16 the dried film 20 remove or decompose the solvents and organics thus producing a green inorganic non-crystalline film 10. These steps are repeated until the desired thickness is achieved. Subsequently, the green film 10 of desired thickness is sintered using a rapid thermal process 18 (RTP) to form the desired crystalline perovskite PLZT structure 22. A typical RTP sinter cycle is a 100° C./second ramp to 725°–775° C., 60 seconds (one minute) at 725°–775° C., and a 90-120 second ramp down to less than 300° C., all in an oxygen atmosphere.

FIG. 3 further illustrates an alternative process whereby the dried gel film 20, after applying it to the substrate, is sintered 24 at a temperature in the range of about 625°–675° C. for at least about 30 minutes, thus producing PLZT 26. There steps are repeated until the desired thickness is achieved. Subsequently, a desired crystalline perovskite PLZT structure 28 is formed.

The dried thin films 20 are preferably baked 16 at about 400° C. The benefit of applying a film, baking it without sintering, and thereafter applying and baking subsequent layers, is that a thick film can be applied without sintering in between each step, which is less time consuming and subjects the substrate to less thermal stress.

After the gel is applied to the substrate, the green thin film 10 of multiple layers of green films are baked and sintered to form the final perovskite PLZT family ceramic, such as PLZT, PZT or PLT ceramic. As used herein, "sintered" or "fired" film means one which has been heated sufficiently to crystallize the inorganic film. Preferably, the sintering is conducted in an oxygen enriched atmosphere. Oxidation in air produces acceptable results, but utilization of an oxygen enriched atmosphere has been found to provide better properties, such as polarization, in the sintered film. A significant aspect of the present invention is that the crystallization of the PLZT thin film ceramic can be accomplished at the lowest possible temperatures, much lower than previously believed for PLZT, to give the desired crystalline form which is the perovskite form. Temperatures in the range of between about 475° C. and about 700° C. and preferably from between about 500° C. to about 650° C., and most preferably from between about 550° C. to about 650° C. In contrast, previously used sputtering techniques were conducted at temperatures over 700° C. In general, in the semiconductor industry, lower processing temperatures are very important to prevent the thermal movement of previously applied dopants, which movement would destroy the characteristics of the resulting circuit. High temperatures can also damage other previously applied integrated circuit elements.

Figure 2:
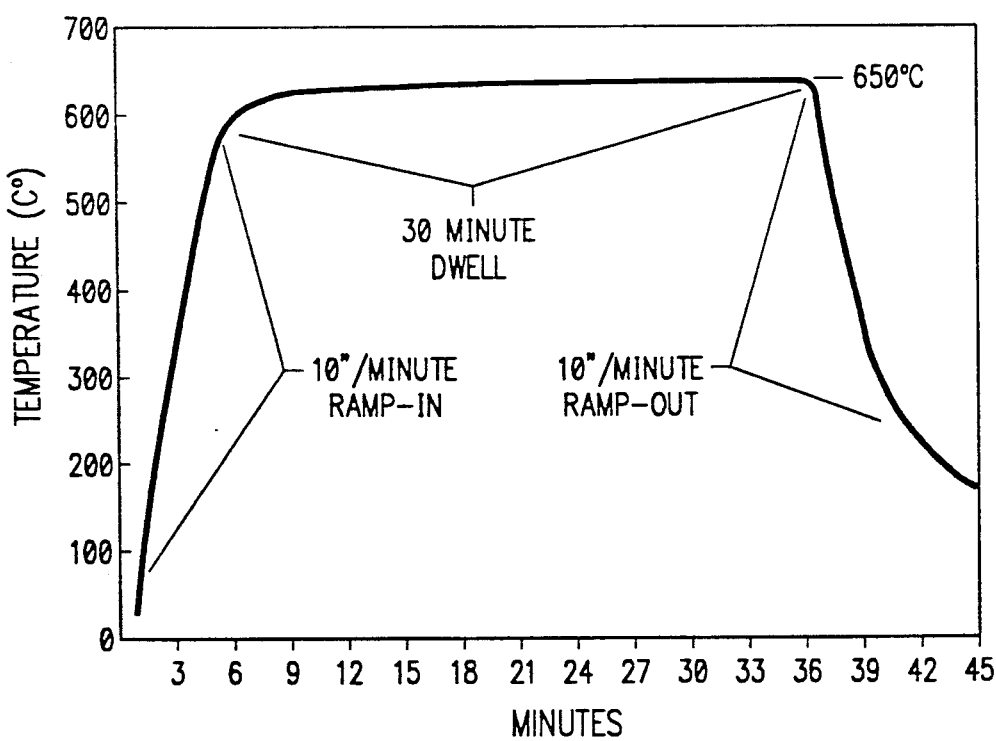
FIG. 2 shows a typical sintering profile and ramp rates for a dried green film.

FIG. 2 illustrates a typical ramp rate and dwell time for PLZT films when the dried gel films have been baked prior to sintering. The dried films applied are generally from about 750 Angstroms to about 1500 Angstroms thick. After the dried films are baked, the baked film is generally from about 275 Angstroms to about 1000 Angstroms thick, and after the baked film is sintered, the sintered is from about 250 Angstroms to about 500 Angstroms thick. For films which are not baked prior to sintering, the initial ramp rate to reach the sintering temperature is about one third slower to allow time for the solvents to boil off.

It is desirable in the present invention to utilize solvents which evolve below 350° C. Also, it is desirable to ramp through the temperature range of from about 450° C. to about 550° C. in a minimum amount of time because within this temperature a pyrochlore phase of the PLZT forms. The upper temperature depends on the composition of the film. This pyrochlore phase is undesirable because it is not ferroelectric. Thus, the presence of solvents that would boil in that range is undesirable because the PLZT composition would be subjected to that temperature range for a longer period of time while the solvents boiled off. Low boiling point solvents are also desirable because they will burn off before the PLZT begins to crystallize. Therefore, the organics can burn off and vaporize without having carbon trapped in the metals as they crystallize. Such carbon inclusion is detrimental because it can prevent the formation of a ferroelectric phase or it can result in the formation of pinholes and pits or other undesirable physical characteristics in the film. Another reason for utilizing an excess of oxygen is to effect the complete and rapid combustion of the organics. In a preferred embodiment, the lead precursor is lead (IV) acetate, the zirconium precursor is zirconium n-butoxide butanol complex, the titanium precursor is titanium (IV) isopropoxide, and the lanthanum precursor is lanthanum 2,4-pentanedionate. These precursors are weighed out in amounts necessary to provide the desired amounts of lead, lanthanum, zirconium and titanium in the final PLZT thin film to be made. The lead tetraacetate is commercially available from Morton Thiokol, Inc., Alfa Products, 152 Andover Street, Danvers, Mass., sold under the designation 57113. It is important that the lead (IV) acetate be opened under an inert atmosphere such as argon or nitrogen. If opened in an air environment, the tetraacetate will decompose and the lead will oxidize and precipitate. This, of course, is not desirable since the oxidized lead will not be soluble. The lead (IV) acetate is dissolved in a suitable acid such as glacial acetic acid at a temperature in the range of from about 70° C. to about 90° C. The amount of glacial acetic acid added is the amount necessary to dissolve the lead tetraacetate and to give a hydrolysis reaction rate for the lead which is about equivalent to the hydrolysis rate for the other metal precursors in their solvents in the subsequent hydrolysis step. These computations should take into account that most commercial lead tetraacetates contain some acetic acid which should be accounted for in the calculations.

Next, a zirconium tetrabutoxide and titanium isopropoxide are dissolved either separately in their respective solvents or in a combined n-butanol and isopropanol mixture. Zirconium tetrabutoxide is commercially available from Alfa Products under the designation 88718 and titanium (IV) isopropoxide is commercially available from Alfa Products under the designation 77115. The zirconium tetrabutoxide is dissolved in butyl alcohol such as n-butanol. The titanium isopropoxide is dissolved in isopropanol. It is possible to make a mixture of the n-butanol and the isopropanol and add the titanium isopropoxide and the zirconium tetrabutoxide to that solution. Again, the solvents are added in amounts sufficient to dissolve the precursors and to give approximately equal reaction rates during the hydrolysis reaction of the precursors. Lanthanum 2,4-pentanedionate, commercially available from Alfa Products under the designation 89859, can be dissolved in the mixture of the zirconium precursor and titanium precursor and their solvents because it is present in small amounts.

The steps required to determine the respective concentrations of solvents are to determine first which precursor requires the greatest portion of solvent on a per unit basis of the precursor to be dissolved. From this, the hydrolysis rate for that precursor and solvent is determined. From this rate, then, the amounts of solvent necessary for the other precursors can be determined. This procedure assures that there is sufficient solvent to dissolve each precursor while achieving approximately equal reaction rates for the hydrolysis reaction.

The zirconium precursor and solvent, titanium precursor and solvent, and lanthanum precursor and solvent are added to the lead tetraacetate and acetic acid solution while maintaining heat and agitation of the solution.

After the homogeneous mixture is obtained for the solutions, deionized water is added in amounts from about 1 mole to about 4 moles, based upon total moles of zirconium and titanium, to partially hydrolyze the precursors during this phase. Heat and agitation are maintained until the clear solution becomes colorless.

The hydrolysis reaction is quenched by the dilution of the mixtures with additional solvent. The generally preferred dilution is done using a mixture of additional solvents in approximately the same ratios as used previously. However, it has been found that a dilution with one or more of the solvents can be effective. In this illustrated embodiment, dilution by adding a mixture of n-butanol and isopropanol in a ratio such that the original ratio is maintained was found acceptable. Dilution assures that the hydrolysis reaction is terminated and quenched. Doubling the volume has been found effective for this purpose. The solution is then heated to boil it down to about 40% of its volume before dilution, which produces a material that is a clear amber solution with a viscosity in the range of from about 1 centipoise to about 5 centipoises, which is appropriate for spin coating. The heat preferably is applied at a reduced pressure, ranging from about 350 mmHg to about 650 mmHg. By reducing the pressure, the reaction temperature is also reduced. As a result, the reaction rate is lowered. Operating at reduced pressure has been found effective to minimize precipitating prior to quenching. A pressure range of from about 350 mmHg to about 650 mmHg is deemed to be preferable. However, it is also recognized that the present reaction may proceed at a pressure lower than 350 mmHg. The resulting sol-gel from the boiling produces organometal polymers with the metal atoms homogeneously mixed throughout the polymer gel. This results in the homogeneous distribution of the metal ions in the final sintered PLZT thin film, which is extremely desirable. It is important that these solubilizing steps and gelling steps be done in a dry atmosphere or an inert atmosphere to control and predict the hydrolysis reaction such that the precipitation of solid oxides is prevented. Also, the resulting sol-gels should be stored and applied under a dry or inert atmosphere to prevent further hydrolysis.

The resulting sol-gel is then applied to a suitable substrate such as a silicon wafer. This is done by known techniques in the semiconductor industry. For example, a silicon wafer is centered on a vacuum chuck and cleaned by flooding with isopropanol or distillate from the sol-gel synthesis and spun dry at high speed. A small amount of the PLZT sol-gel previously produced. For example, a volume of about 10 microliters per centimeter squared is placed on the center of the substrate. The spinner is accelerated to an RPM chosen to give an even coat of the desired thickness. This is a function primarily of viscosity and specific gravity of the PLZT sol-gel and flow characteristics of that sol-gel upon the particular substrate substance. Thereafter, the coated substrate is subjected to baking for the volatilization of solvent from the sol-gel and subsequent sintering of the ferroelectric layer to the final PLZT thin film by using either a RTP or diffusion furnace.

The sintering step involves a ramp up of the temperature to the desired maximum temperature. The film thus has the solvents and organics removed by volatilization or pyrolytic decomposition but PLZT crystal formation has not yet occurred. As FIG. 3 illustrates, this method involves applying a thin dried gel film 3 to the substrate, thereafter baking 4 the dried film 3, remove or decompose the solvents and organics thus producing a green inorganic non-crystalline film. This is repeated to achieve the desired thickenss. Subsequently, the green film 5 of desired thickness is sintered using a rapid thermal process 6 to form the desired crystalline perovskite PLZT structure 7. A typical RTP cycle is a 100° C./second ramp to 725°-775° C., 60 seconds (one minute) at 725°-775° C., and a 90-120 second ramp down to <300° C., all in an oxygen ambient atmosphere. The preferred perovskite crystalline structure for the PLZT film is produced. As explained above, the solvents should be chosen so that they boil off below about 350° C. and so that the sintering/annealing step is done in an oxygen enriched atmosphere to insure volatilization and combustion of all the organo solvents and to minimize the time in which the PLZT gel is initially exposed to the temperature range wherein the nonferroelectric crystalline form is made. After sufficient dwell time at the maximum temperature to completely form the sintered PLZT thin film ceramic, the finished product is then ramped down in temperature and removed from the furnace. The ramp rates leaving the furnace are not extremely critical because the perovskite crystalline form does not change to the nonferroelectric form while passing through the temperature range of from about 350° C. to about 450° C. The major consideration is thermal shock to the substrate and sintered PLZT thin film. The sintered PLZT film and the substrate structure which receives the film should be selected to minimize differences in thermal contraction rates to prevent cracking.

It was found that a PLZT solution of 2 centipoises, when applied to the silicon substrate, produced an organometallic film on the substrate about 1500 Angstroms thick. After the volatilization, sintering and annealing processing, the resulting PLZT ceramic layer was approximately 500 Angstroms thick. Thicker layers of PLZT ceramic can be applied by multiple applications of PLZT gel over PLZT ceramic layers previously applied. To some extent the thickness of the PLZT can also be increased by increasing the viscosity of the PLZT gel. Generally, it is not desirable to attempt to apply a PLZT gel beyond 1000 Angstroms in sintered thickness, because the thicker the gel is applied the more likely it is to crack. Thicker layers are instead produced with multiple coats.

The resulting PLZT layer on the substrate can then be patterned to form the desired circuit element configurations upon the wafer as described in commonly assigned U.S. Pat. No. 4,759,823.

Other methods known in the semiconductor industry can be used for applying the film to the substrate such as spray or dip coating.

EXAMPLES

In the following examples the mole ratios have been normalized to Pb+La=1 (or 100%).

EXAMPLE 1

PLZT, 8/40/60 Plus 10% Excess Lead

The beginning point is calculation of the stoichiometry of the desired composition expressed as the L/Z/T ratio. The formula weight for each precursor and a number that determines batch size are factored in. The product of the L/Z/T ratio number and the batch size factor equals moles of element or precursor. Two additional factors are used in calculating the amount of Pb precursor: first, the percentage of excess Pb; and second, a correction of the quantity of solvent in the Pb precursor. An example of our calculations follows (using an 8/40/60 PLZT with 10% excess Pb). The Pb, La, Zr and Ti precursors are commercially available from Morton Thiokol, Inc., Alfa Products, 152 Andover Street, Danvers, Mass. 01923.

| | Alfa Catalog |
|---|---|
| # 57113 | Lead (IV) acetate (10% acetic acid); 90% Formula Weight (F.W.) 443.37 |
| # 89859 | Lanthanum 2,4-pentanedionate; P.W. 436.24 |
| # 88718 | Zirconium n-butoxide butanol complex; F.W. 457.81 |
| # 77115 | Titanium (IV) isopropoxide; F.W. 284.25 |
| # 302506 | Acetic acid, Glacial |
| # 11632 | 1-butanol |
| # 19397 | Isopropanol |

The calculation for PLZT, 8/40/64 plus 10% excess Pb is as follows:

Pb Precursor calculation:

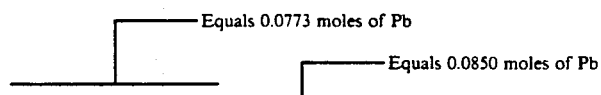

$$\underbrace{(100-8)}_{\text{correction}} \times \underbrace{(8.4E-4)}_{\substack{\text{Pb stoichiometry (based on L/Z/T ratio)}}} \times \underbrace{(1.1)}_{\substack{\text{Batch size} \\ \text{Excess Pb}}} \times \underbrace{(443.37)}_{\text{Formula weight}} \times \underbrace{(1.1111)}_{\text{Solvent}} = 41.88 \text{ g}$$

La precursor calculation:

$$\underbrace{(8)}_{\text{Equals 0.0067 moles of La}} \times (8.4E-4) \times (436.24) = 2.93 \text{ g}$$

ZR precursor calculation:

$$\underbrace{(40)}_{\text{Equals 0.0336 moles of Zr}} \times (8.4E-4) \times (457.81) = 15.38 \text{ g}$$

Ti precursor calculation:

$$\underbrace{(60)}_{\text{Equals 0.0504 moles of Ti}} \times (8.4E-4) \times (284.25) = 14.33 \text{ g}$$

Note that:
(0.0773 mol Pb − 0.0067 mol La) = (0.0336 mol Zr + 0.0504 mol Ti) Acetic acid
(solvent for Pb precursor) = 10 ml/gram of Pb precursor*
(41.88) × (10) = 418.8 ml
1-Butanol (solvent for Zr precursor) = 4000 ml/mol of Zr*
(4000) × (40) × (8.4E-4) = 134.4 ml
Isopropanol (solvent for Ti precursor) = 4000 ml/mol of Ti*
(4000) × (60) × (8.4E-4) = 201.6 ml
Deionized water = 4 moles/mole of Zr + Ti
(4) × ((40 + 60) × (8.4E-4)) × (18) = 6.05 g (water is actually measured volumetrically with density equal to 1.0)
*Determined empirically.

which is repeated for convenience:

|  | Mole Ratio | Actual Amount |
|---|---|---|
| Lead (IV) acetate | 0.92 (1.12)* | 41.88 g |
| Lanthanum 2,4 pentanedionate | 0.08 | 2.93 g |
| Zirconium n-butoxide butanol complex | 0.40 | 15.38 g |
| Titanium isopropoxide | 0.60 | 14.33 g |
| Acetic acid, glacial | 77.00 | 418.8 ml |
| n-butanol | 17.5 | 134.4 ml |
| Isopropanol | 31.1 | 201.6 ml |
| Deionized water | 4.0 | 6.05 ml |

It has been found that the sum of the calculated quantities without regard for the units involved (grams or milliliters) is a good approximation (within one percent or so) of the volume obtained when these materials are in solution.

41.9 + 418.8 + 2.9 + 15.4 + 14.3 + 134.4 + 201.6 + 6.1 = 835.4

835.4 ml is therefore the volume of a 50:50 mixture of 1-butanol and isopropanol required to double the solution volume, thus quenching the reaction prior to boiling back to final volume.

*Lead is adjusted to account for excess lead and the amount of acetic acid in commercially packaged lead (IV) acetate (10%). The zirconium n-butoxide butanol complex was dissolved in the n-butanol and combined with the titanium solution (titanium isopropoxide dissolved in isopropanol). The lanthanum 2,4-pentanedionate was dissolved in the solution of titanium and zirconium. In a separate vessel the lead (IV) acetate was dissolved in the glacial acetic acid under an inert atmosphere while agitating and heating it in a temperature in the range of from about 70° to about 90° C. The solution containing the zirconium, lanthanum and titanium was added to the lead solution while maintaining heat and agitation. The deionized water was then added. The amounts above produced a solution with a volume of 835 ml.

This volume was then doubled by the addition of 835 ml of a mixture in a ratio of 1:1 by volume of n-butanol and isopropanol, resulting in a total volume of 1670 ml. This was then boiled back to a volume of 334 ml or approximately 20% of the starting solution. An alternate method is to base the amount of boil-off to base final volume on a fixed concentration of moles of P+L+Z+T/unit volume; specifically 5E-4 moles/ml. In this calculation excess Pb is disregarded. In this example there are:

$$((100-8)+8+40+60) \times (8.4E-4) = 0.168 \text{ moles of } P+L+Z+T$$

Therefore, 0.168 moles/(5E-4 moles/ml) = 336 ml. The targeted final sol-gel volume is 336 ml. Viscosity of the finished sol-gel is measured at room temperature with a falling ball viscometer (Gilmont #1 with stainless steel ball); density is determined by weighing an accurately measured volume of sol-gel (25 ml using a volumetric pipet) on an analytical balance. A sol-gel with a viscosity of about 1.4 cp resulted. The prepared sol-gel was spun onto a silicon substrate of 100 ml in diameter at approximately 2000 rpm to produce a sol-gel PLZT layer of about 1500 Angstroms in thickness. This was then heated in a furnace from 549° C. to 551° C. at a ramp of 100° C. per minute to a temperature of 550° C. where it was held for about 15 minutes to form the perovskite PLZT. Subsequently, the PLZT substrate was returned to room temperature by ramping it down at a rate of 100° C. per minute.

EXAMPLE 2

PLT, 15/0/100 plus 10% excess lead

| PLT, 15/0/100 plus 10% excess lead |
| --- |
| Pb precursor calculation: |
| (100-15) × (5.0E-4) × (1.1) × (443.37) × (1.111) = 23.03 g |
| La precursor calculation: |
| (15) × (5.0E-4) × (436.24) = 3.27 g |
| Zr precursor calculation: |
| NONE |
| Ti precursor calculation: |
| (100) × (5.0E-4) × (284.25) = 14.21 g |
| Acetic acid: |
| (23.03) × (10) = 230.3 ml |
| 1-Butanol: |
| NONE |
| Isopropanol: |
| (4000) × (100) × (5.0E-4) = 200.0 ml |
| Deionized water: |
| (4) × (100) × (5.0E-4) × (18) = 3.6 g (or ml) | which is repeated for convenience:

|  | Mole Ratio | Actual Amount |
| --- | --- | --- |
| Lead (IV) acetate | 0.85 (1.039) | 23.03 g |
| Lanthanum 2,4 pentanedionate | 0.15 | 3.27 g |
| Zirconium | 0.0 | 0.0 |
| Titanium isopropoxide | 1.0 | 14.21 g |
| Acetic acid | 77.5 | 230.3 ml |
| n-butanol | 0.0 | 0.0 |
| Isopropanol | 51.9 | 200.0 ml |
| Deionized water | 4.0 | 3.6 ml |

Volume doubling calculation:
23.0+3.3+14.2+230.3+200.0+3.6=474.4 ml Volume is doubled with 474.4 ml or 50:50 mixture of 1-butanol and isopropanol.
Final volume calculation:
30 (((100−15)+15+0+100)×(5.0E−4)) moles/(5E−4 moles/ml 200 ml Titanium isopropoxide was dissolved in isopropanol.

The lanthanum 2,4-pentanedionate was dissolved in the solution of titanium. In a separate vessel the lead (IV) acetate was dissolved in the glacial acetic acid under an inert atmosphere while agitating and heating it to a temperature in the range of from about 70° C. to about 90° C. The solution containing the lanthanum and titanium was added to the lead solution while maintaining heat and agitation. The deionized water was then added. The amounts above produced a solution with a volume of 474 ml.

This volume was then doubled by the addition of 474 ml of a mixture of n-butanol and isopropanol in a ratio of 1:1 by volume, resulting in a total volume of 948 ml. It was then boiled back to a volume of 190 ml resulting in a sol-gel with a viscosity of about 1.9 cp. The prepared sol-gel was spun onto a silicon substrate of 50 mm diameter at approximately 2000 rpm to produce a sol-gel PLZT layer of about 1500 Angstroms in thickness.

It was then baked on a hot plate for about 2 minutes at about 400°C. It was repeated for a total of eight coats. It was then annealed or sintered in a furnace from 648° C. to 651° C. at a ramp of 100° C. per minute to a temperature of 650° C. where it was held for about 30 minutes to form the perovskite PLZT. Subsequently, the PLZT substrate was returned to room temperature by ramping it at a rate of 100° C. per minute.

EXAMPLE 3

| PZT. 0/50/50 plus 10% excess Pb. |
| --- |
| Pb precursor calculation: |
| (100-0) × (4.326E-4) × (1.1) × (443.37) × (1.111) = 23.44 g |
| La precursor calculation: |
| NONE |
| Zr precursor calculation: |
| (50) × (4.326E-4) × 457.81) = 9.90 g |
| Ti precursor calculation: |
| (50) × (4.326E-4) × (284.25) = 6.15 g |
| Acetic acid: |
| (23.44) × (10) = 234.4 ml |
| 1-Butanol: |
| (4000) × (50) × (4.326E-4) = 86.5 ml |
| Isopropanol: |
| (4000) × (50) × (4.326E-4) = 86.5 ml |
| Deionized water: |
| (4) × (50 + 50) × (4326E-4) × (18) = 3.11 g (or ml) |
| Volume doubling calculation: |
| 23.4 + 9.9 + 6.2 + 234.4 + 86.5 + 86.5 + 3.1 = 450 ml |
| Volume is doubled with 450 ml or 50:50 mixture of 1-butanol and isopropyl. |
| Final volume calculation: |
| (((100-0) + 0 + 50 + 50) × (4.326E-4) moles/ (5E-4 moles/ml 173 ml |

We claim:

1. A method of preparing a mixture suitable for spin deposition on substrates, comprising:
   (a) solubilizing amounts of two or more precursors of lead, titanium, zirconium and lanthanum in predetermined solvents, said solvents being different for each precursor at proportions such that upon hydrolysis the metal precursors will exhibit approximately equal reaction rates;
   (b) mixing under an inert atmosphere at a pressure from about 350 mmHg to about 650 mmHg the metal precursors and solvents at a temperature sufficient to maintain the metal precursors in solution and for a period of time sufficient to produce a homogeneous mixture;
   (c) adding a predetermined amount of water to resulting solution sufficient to begin a hydrolysis reaction without causing precipitation of solids while maintaining the mixture under an insert atmosphere; and
   (d) boiling the mixture at a temperature sufficient to vaporize said solvents and azeotrope water to increase a viscosity suitable for spin coating.

2. The method of claim 1 comprising the additional step of diluting the mixture resulting from step (c) with additional amounts of solvents in order to quench the hydrolysis reaction followed by step (d).

3. The method of claim 1 wherein said precursors are selected from the group comprising alkoxides of lanthanum, alkioxides of lead, alkoxides of titanium, alkoxides of zirconium, esters of lead, esters of titanium, and esters of zirconium.

4. The method of claim 2 wherein said metal precursors are selected from the group comprising alkoxides of lanthanum, alkoxides of lead, alkoxides of titanium, alkoxides of zirconium, esters of lead, esters of titanium, and esters of zirconium.

5. The method of claim 1 wherein said precursors are selected from the group comprising lanthanum 2,4-pentanedionate, zirconium n-butoxide, titanium (IV) isopropoxide, and lead tetraacetate.

6. The method of claim 2 wherein said precursors are selected from the group comprising lanthanum 2,4-pentanedionate, zirconium n-butoxide, titanium (IV) isopropoxide, and lead tetraacetate.

7. The method of claim 1 further comprising the steps of spinning the resulting solution onto a substrate to form a thin film, and then heating the coated substrate at a temperature in the range of from about 475° C. to about 700° C. for a period sufficient to sinter the applied thin film.

8. The method of claim 2 further comprising the steps of spinning the resulting solution onto a substrate to form a thin film, and then heating the coated substrate at a temperature in the range of from about 475° C. to about 700° C. for a period sufficient to sinter the applied thin film.

9. The method of claim 3 further comprising the steps of spinning the resulting solution onto a substrate to form a thin film, and then heating the coated substrate at a temperature in the range of from about 500° C. to about 650° C. for a period sufficient to sinter the applied thin film.

10. The method of claim 4 further comprising the steps of spinning the resulting solution onto a substrate to form a thin film, and then heating the coated substrate at a temperature in the range of from about 500° C. to about 650° C. for a period sufficient to sinter the applied thin film.

11. The method of claim 5 further comprising the steps of spinning the resulting solution onto a substrate to form a thin film, and then heating the coated substrate at a temperature in the range of from about 500° C. to about 650° C. for a period of sufficient to sinter the applied thin film.

12. A method of preparing a PLZT mixture suitable for spin deposition on substrates, comprising:
    (a) solubilizing a lead precursor in a first solvent;
    (b) solubilizing a titanium precursor in a second solvent;
    (c) solubilizing a zirconium precursor in a third solvent;
    (d) mixing under an inert atmosphere at a pressure of from about 350 mmHg to about 650 mmHg the dissolved lead, titanium and zirconium precursor in the first, second and third solvents together at a temperature sufficient to maintain the metals in solution and for a period of time sufficient to produce a homogeneous mixture;
    (e) adjusting the proportions of said first, second, and third solvents such that the reaction rates of the zirconium, titanium and lead upon hydrolysis of the resulting mixture will be approximately equal while maintaining the mixture under an inert atmosphere;
    (f) adding a lanthanum precursor to the mixture;
    (g) adding a predetermined amount of water to the resulting solution sufficient to begin a hydrolysis reaction without causing precipitation of solids while maintaining the mixture under an insert atmosphere; and
    (h) boiling the mixture at a temperature sufficient to vaporize the said azeotrope water and solvents until the mixture reaches a viscosity suitable for spin coating.

13. The method of claim 12 comprising the addition of diluting the mixture from step (g) with additional amounts of one or more of said solvents in an amount sufficient to quench the hydrolysis reaction followed by step (h).

14. The method of claim 12 wherein said precursors of said lead, titanium and zirconium are selected from the group comprising alkoxides, and esters of said lead, titanium and zirconium, and said lanthanum precursor is selected from the group comprising alkoxides, and esters of lanthanum.

15. The method of claim 13 wherein said precursors of said lead, titanium and zirconium are selected from the group comprising alkoxides, and esters of said lead, titanium and zirconium, and said lanthanum precursor is selected from the group comprising alkoxides, and esters of lanthanum.

16. The method of claim 12 further comprising the steps of spinning the resulting PLZT solution onto a substrate to form a thin film, and then heating the coated substrate at a temperature in the range of from about 475° C. to about 700° C. for a period sufficient to sinter the PLZT film.

17. The method of claim 13 further comprising the steps of spinning the resulting PLZT solution onto a substrate to form a thin film, and then heating the coated substrate at a temperature in the range of from about 475° C. to about 700° C. for a period sufficient to sinter the PLZT film.

18. A method for preparing a PLZT mixture suitable for spin deposition on substrates, comprising:
    (a) solubilizing a lead precursor in a first solvent;
    (b) solubilizing a titanium precursor in a second solvent compatible with said first solvent;
    (c) solubilizing a zirconium precursor in a third solvent compatible with said first and second solvents;
    (d) mixing under an inert atmosphere at a pressure of from about 350 mmHg to about 650 mmHg the dissolved lead, titanium and zirconium precursor in the first, second and third solvents together at a temperature sufficient to maintain the metals in solution and for a period of time sufficient to produce a homogeneous mixture;
    (e) adjusting the proportions of said first, second, and third solvents such that the reaction rates of the zirconium, titanium and lead upon hydrolysis of the resulting mixture will be approximately equal while maintaining the mixture under an inert atmosphere;
    (f) adding lanthanum to the mixture;
    (g) adding water to the resulting solution sufficient to begin a hydrolysis reaction of the precursors without causing precipitation of solids while maintaining the mixture under an insert atmosphere; and
    (h) boiling the mixture at a temperature sufficient to vaporize the water and said solvents, reducing the solvent and water content of the mixture to increase the viscosity suitable for spin coating.

19. The method of claim 18 comprising the additional step of diluting the mixture resulting from step (g) with additional amounts of one or more of said solvents in an amount sufficient to quench the hydrolysis reaction thereafter followed by step (h).

20. The method of claim 18 wherein the precursors of said lead, titanium and zirconium are selected from the group comprising oxides, acetates and esters of said lead, titanium and zirconium.

21. The method of claim 19 wherein the precursors of said lead, titanium and zirconium are selected from the group comprising oxides, acetates and esters of said lead, titanium and zirconium.

22. The method of claim 18 further comprising the steps of spinning the resulting PLZT solution onto a substrate to form a thin film, and then heating the coated substrate at a temperature in the range of from about 475° C. to about 700° C. for a period sufficient to sinter the PLZT film.

23. The method of claim 19 further comprising the steps of spinning the resulting PLZT solution onto a substrate to form a thin film, and then heating the coated substrate at a temperature in the range of from about 475° C. to about 700° C. for a period sufficient to sinter the PLZT film.

24. The method of claim 18 wherein said lead precursor is lead tetraacetate, said zirconium precursor is zirconium n-butoxide, and said titanium precursor is titanium isopropoxide.

25. The method of claim 19 wherein said lead precursor is lead tetraacetate, said zirconium precursor is zirconium n-butoxide, and said titanium precursor is titanium isopropoxide.

26. A method of preparing a mixture suitable for spin deposition on substrates, comprising:
   (a) solubilizing amounts of one or more precursors of lead, titanium, and zirconium in predetermined solvents, said solvents being different for each precursor, at proportions such that upon hydrolysis the metal precursors will exhibit approximately equal reaction rates;
   (b) mixing the metal precursors and solvents together with lanthanum;
   (c) maintaining the mixture under an inert atmosphere at a pressure of from about 350 mmHg to 650 mmHg, at a temperature sufficient to maintain the metal precursors and lanthanum in solution, and for a period of time sufficient to produce a homogeneous mixture;
   (d) adding a predetermined amount of water to the resulting solution sufficient to begin a hydrolysis reaction without causing precipitation of solids while maintaining the mixture under an inert atmosphere; and
   (e) boiling the mixture at a temperature sufficient to vaporize said solvents and water to increase the viscosity suitable for spin coating.

27. The method of claim 26 comprising the additional step of diluting the mixture resulting from step (d) with additional amounts of solvents in order to quench the hydrolysis reaction followed by step (c).

28. The method of claim 26 wherein said precursors are selected from the group comprising alkoxides of lead, alkoxides of titanium, alkoxides of zirconium, esters of lead, esters of titanium, and esters of zirconium.

29. The method of claim 27 wherein said metal precursors are selected from the group comprising alkoxides of lead, alkoxides of titanium, alkoxides of zirconium, esters of lead, esters of titanium, and esters of zirconium.

30. The method of claim 26 wherein said precursors are selected from the group comprising zirconium n-butoxide, titanium (IV) isopropoxide, and lead tetraacetate.

31. The method of claim 27 wherein said precursors are selected from the group comprising zirconium n-butoxide, titanium (IV) isopropoxide, and lead tetraacetate.

32. The method of claim 26 further comprising the steps of spinning the resulting solution onto a substrate to form a thin film, and then heating the coated substrate at a temperature in the range of from about 475° C. to about 700° C. for a period sufficient to sinter the applied thin film.

33. The method of claim 27 further comprising the steps of spinning the resulting solution onto a substrate to form a thin film, and then heating the coated substrate at a temperature in the range of from about 475° C. to about 700° C. for a period sufficient to sinter the applied thin 34. The method of claim 28 further comprising the steps of spinning the resulting solution onto a substrate to form a thin film, and then heating the coated substrate at a temperature in the range of from about 500° C. to about 650° C. for a period sufficient to sinter the applied thin film.

35. The method of claim 29 further comprising the steps of spinning the resulting solution onto a substrate to form a thin film, and then heating the coated substrate at a temperature in the range of from about 500° C. to about 650° C. for a period sufficient to sinter the applied thin film.

36. The method of claim 30 further comprising the steps of spinning the resulting solution onto a substrate to form a thin film, and then heating the coated substrate at a temperature in the range of from about 500° C. to about 650° C. for a period sufficient to sinter the applied thin film.

37. The method of claim 1 further comprising the steps of spinning the resulting solution onto a substrate and then heating the coated substrate at a ramp rate of 100° C. per second to a temperature in the range of 725°–775° C., maintaining the temperature in the range of 725°–775° C. for at least about 60 seconds, followed by a ramp down to less than 300° C. in about 90–120 seconds.

38. The method of claim 37 wherein the heating is performed under an oxygen atmosphere.

* * * * *

UNITED STATES PATENT AND TRADEMARK OFFICE
CERTIFICATE OF CORRECTION

PATENT NO. : 5,116,643

DATED : May 26, 1992

INVENTOR(S) : Miller et al.

It is certified that error appears in the above-identified patent and that said Letters Patent is hereby corrected as shown below:

Column 1, line 55, delete "$Pb_{13x/2}La_x$" and insert therefore --$Pb_{1-3x/2}La_x$--.

Column 1, line 57, delete "an" and insert therefore --and--.

Column 7, line 67, delete "for example)" and insert therefore --(for example)--.

Column 8, line 6, delete "pb" and insert therefore --Pb--.

Column 8, line 55, delete "crystalline" and insert therefore --crystallize--.

Column 10, line 11, delete "experiment" and insert therefore --experimental--.

Column 19, line 1, delete "ml" and insert therefore --mm--.

Column 20, line 33, after the solid line insert as a new paragraph --Other ferroelectric compositions based on PLZT sol-gel synthesis can be made using other metal precursors such as tin, tantalum, iron and niobium for the "A" or "B"

UNITED STATES PATENT AND TRADEMARK OFFICE
CERTIFICATE OF CORRECTION

PATENT NO. :   5,116,643

DATED      :   May 26, 1992

INVENTOR(S) :  Miller et al.

It is certified that error appears in the above-identified patent and that said Letters Patent is hereby corrected as shown below:

site cations (depending on ionic radius and oxidation state). For example, a film was made utilizing a product having the characteristics $Pb_{1.0}(Zr_{0.245}Sn_{0.245}Ti_{0.49}Ta_{0.02})O_3$ using standard precursors for lead, zirconium and titanium and tin (IV) acetate for Sn and tantalum (V) ethoxide for TA. Other precursors which have been used include acetate or alkoxide precursors of Fe, iron, and Nb (niobium). Various compositions of PLZT sol-gels have been prepared producing a clear stable sol-gel solution from about 350 mmHg to about 650 mmHg. Preferably, this is also done in an inert atmosphere such as nitrogen.--.

Column 20, line 63, delete "alkioxides" and insert therefore --alkoxides--.

Signed and Sealed this

Second Day of November, 1993

*Attest:*

BRUCE LEHMAN

*Attesting Officer*   *Commissioner of Patents and Trademarks*